(12) United States Patent
Doberenz

(10) Patent No.: US 6,664,556 B2
(45) Date of Patent: Dec. 16, 2003

(54) METHOD AND APPARATUS FOR A PHOTOTRANSISTOR PULSE WIDTH CONVERTER

(75) Inventor: Philip W. Doberenz, Tigard, OR (US)

(73) Assignee: Intel Corporation, Santa Clara, CA (US)

( * ) Notice: Subject to any disclaimer, the term of this patent is extended or adjusted under 35 U.S.C. 154(b) by 389 days.

(21) Appl. No.: 09/773,978

(22) Filed: Jan. 31, 2001

(65) Prior Publication Data

US 2002/0100883 A1 Aug. 1, 2002

(51) Int. Cl.$^7$ ................................................. G02B 26/00
(52) U.S. Cl. ............. 250/551; 250/214 R; 250/214 DC
(58) Field of Search ............................... 250/551, 208.1, 250/208.4, 214 P, 214 DC, 214 R; 345/166; 348/297; 327/514

(56) References Cited

U.S. PATENT DOCUMENTS 5,623,284 A * 4/1997 Hsu et al. ................... 345/166
6,504,409 B1 * 1/2003 Laletin ......................... 327/175
6,590,610 B2 * 7/2003 Castro et al. ................ 348/297

* cited by examiner

*Primary Examiner*—Edward J. Glick
*Assistant Examiner*—Hoon Song
(74) *Attorney, Agent, or Firm*—Marger Johnson & McCollum P.C.

(57) ABSTRACT

A system for measuring output voltage from a photodetector. The system includes a photodetector that generates a photodetector output signal, a ramp generator that generates a ramp signal and a comparator that outputs a signal level based on which of the two signals is larger. The voltage level of the output of the phototransistor determines how long it will take for the ramp voltage to catch up and cross over the phototransistor voltage. The crossover time determines the width of an output signal and is directly proportional to the voltage level. A microcontroller can then determine the pulse width by multiple samplings and therefore determine photodetector voltage.

8 Claims, 4 Drawing Sheets

METHOD AND APPARATUS FOR A PHOTOTRANSISTOR PULSE WIDTH CONVERTER

BACKGROUND

1. Field

This disclosure relates to circuits for converting a varying voltage level to a varying width pulse, more particularly to a circuit making that conversion such that the varying width pulse can be sampled.

2. Background

Optical couplers typically include an emitter and detector pair. The detector detects emission or lack of emission from the emitter. The emitter is typically a source of light, such as a Light-Emitting Diode (LED) and the detector may be a phototransistor. The voltage level output by the phototransistor is directly related to the amount of light detected from the emitter.

A common application of these pairs is in user pointing devices, such as a computer mouse. These devices may use the pairs in quadrature phase decoding. Quadrature phase decoding may be used to detect movement of an object. In a typical configuration, a decoder wheel is used, inset such that there are slots around the wheel. A phototransistor with two outputs A and B is positioned such that the A and B photosensors are aligned with the slots and offset so that their quadrature outputs are 90 degrees out of phase. As the decoder wheels spin, they determine the outputs for A and B as either one (1) or zero (0). This results in the A and B outputs, typically sine waves, being ninety degrees out of phase with each other. The two digital outputs then create four possible outputs, hence the name quadrature.

Alternatively, photosensors can be used to detect movement of other objects between the photosensor and the emitter. In some examples the emitters are light emitting diodes (LEDs). The LEDs are left in the ON state and interruption of the light emitted and the detector indicates movement of an object in between the two, whether that object is a decoder wheel shutter or some other type of object.

Converting the output of a photodetector to a 1 or 0 is difficult. Variations in output brightness of the LED, and photodetector sensitivity, along with manufacturing variations, may make it impractical to use a standard photodetector output value for the threshold. There may need to be a different threshold value for each photodetector output. To lower manufacturing costs, it's desirable that there be some sort of automatic method to find the threshold values of a wide range devices.

Another problem with any sensor with a binary output is the problem of what happens to the output when the input is sitting at the threshold value. The output could then be either a 1 or 0. Usually, system noise causes the input to vary slightly, which could cause the output to change, even though the wheel is not moving. The common way to prevent false movement is with some form of hysterisis. With hysterisis, there are two thresholds—a high threshold and a low one. With input voltage hysterisis, if the input is low, it has to cross the high threshold before the output changes, and conversely, if the input is high, it has to cross the low threshold. The two threshold points are far enough apart to prevent noise on the input from causing output oscillations. Voltage hysterisis is commonly done with positive feedback from the output back to the input, so the output value (state) determines the input voltage threshold.

If the computer mouse or object with the optical coupler has a limited power supply, such as a battery, leaving the LED ON indefinitely will unnecessarily consume power. However, pulsing the LED between OFF and ON could lead to inaccurate data because input hysterisis will not work unless the state information is saved away between pulses. One solution might be to have analog to digital converters on the inputs and convert the analog voltage to a digital value, which can then be stored in the microcontroller. The problem with this approach is the added cost of analog to digital converters on inputs. Some technique is needed that will allow the LED to be pulsed to save power yet provide accurate data.

BRIEF DESCRIPTION OF THE DRAWINGS

The invention may be best understood by reading the disclosure with reference to the drawings, wherein.

DETAILED DESCRIPTION OF THE EMBODIMENTS

Figure 1:
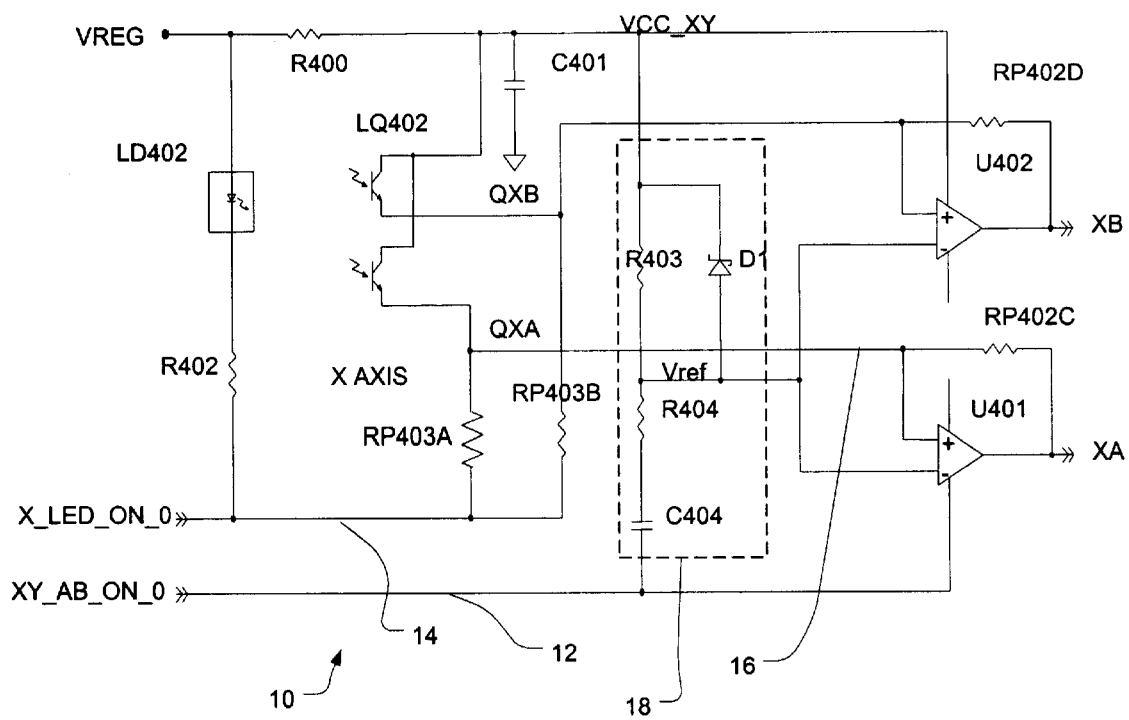
FIG. 1 is a diagram of one embodiment of a circuit in accordance with the invention.

FIG. 1 shows a circuit diagram of one embodiment of a circuit in accordance with the invention. The outputs of the photodetector LQ402 are QXA and QXB, which will be used to determine the outputs XA and XB mentioned previously. A similar circuit to that in FIG. 1 will be used to determine the outputs YA and YB, but only one example of the circuit is necessary to understand application of the invention.

Figure 3:
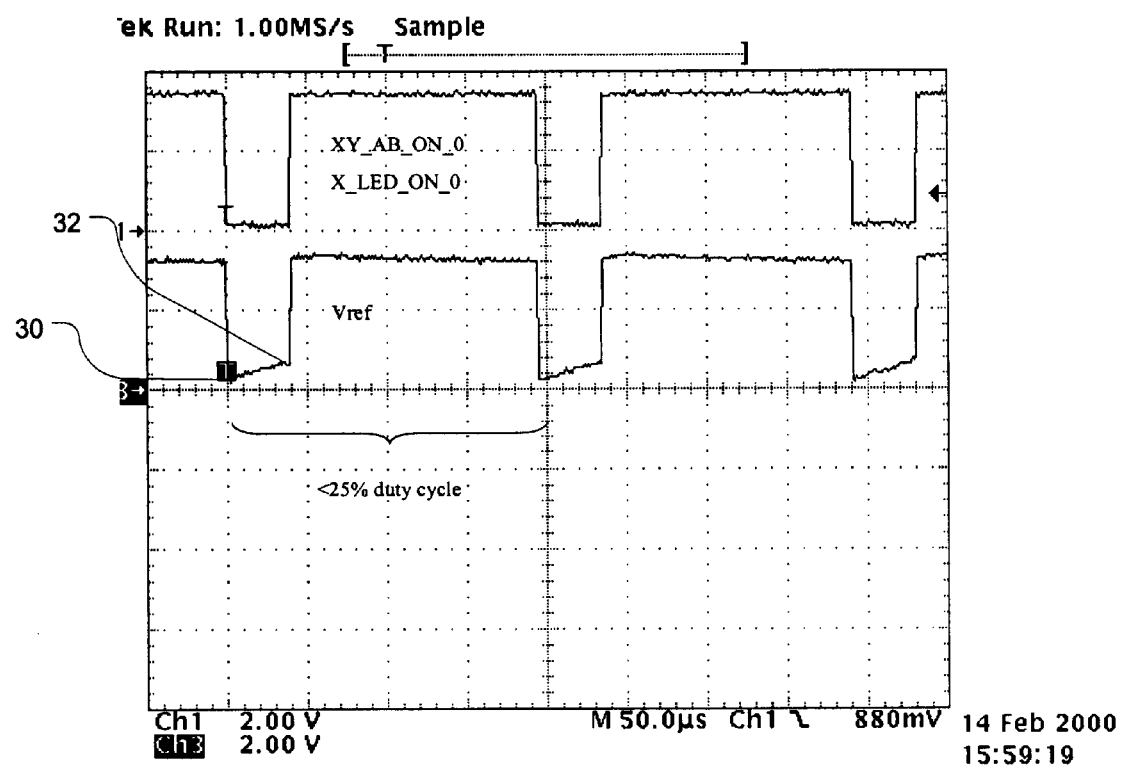
FIG. 3 is an oscilloscope trace of the input signals and an output signal for a comparator, in accordance with the invention.

The signals X_LED_ON_0 on line 14 and XY_AB_ON_0 on line 12 are identical output from a microcontroller. They provide power to the LEDs, resulting in the pulsing of the LEDs to save power. As can be seen in the oscilloscope traces of FIG. 3, these signals have a 25% duty cycle. At this duty cycle, the LEDs use approximately 25% of the power they would if they were ON continuously. Also shown is the signal $V_{ref}$, which can be seen as a ramp. In this discussion, the signal will be referred to as a ramp signal or ramp voltage. The ramp voltage has a low shown at 30 increasing to a high voltage level shown at 32.

Referring back to FIG. 1, it can be seen that a ramp generator circuit 18, enclosed by the dotted box, generates the Vref signal. The output of the ramp generator, the ramp signal, and the output of the photodetector LQ402 on line 16 are compared by the comparator U401. A similar comparison is made for QXB, the output of the XB photodetector. As discussed previously, in quadrature phase decoding operations, two photodetectors A and B are used for each axis.

There are problems with determining the threshold level of various photodetector outputs, as well as problems when the LEDs are pulsed. However, it is possible to convert the photodetector output voltage level into a digital pulse of varying width. The width of the pulse will be sampled and analyzed and deemed to be either a 1 or a 0, according to methods and processes outside the scope of this disclosure.

Figure 4:
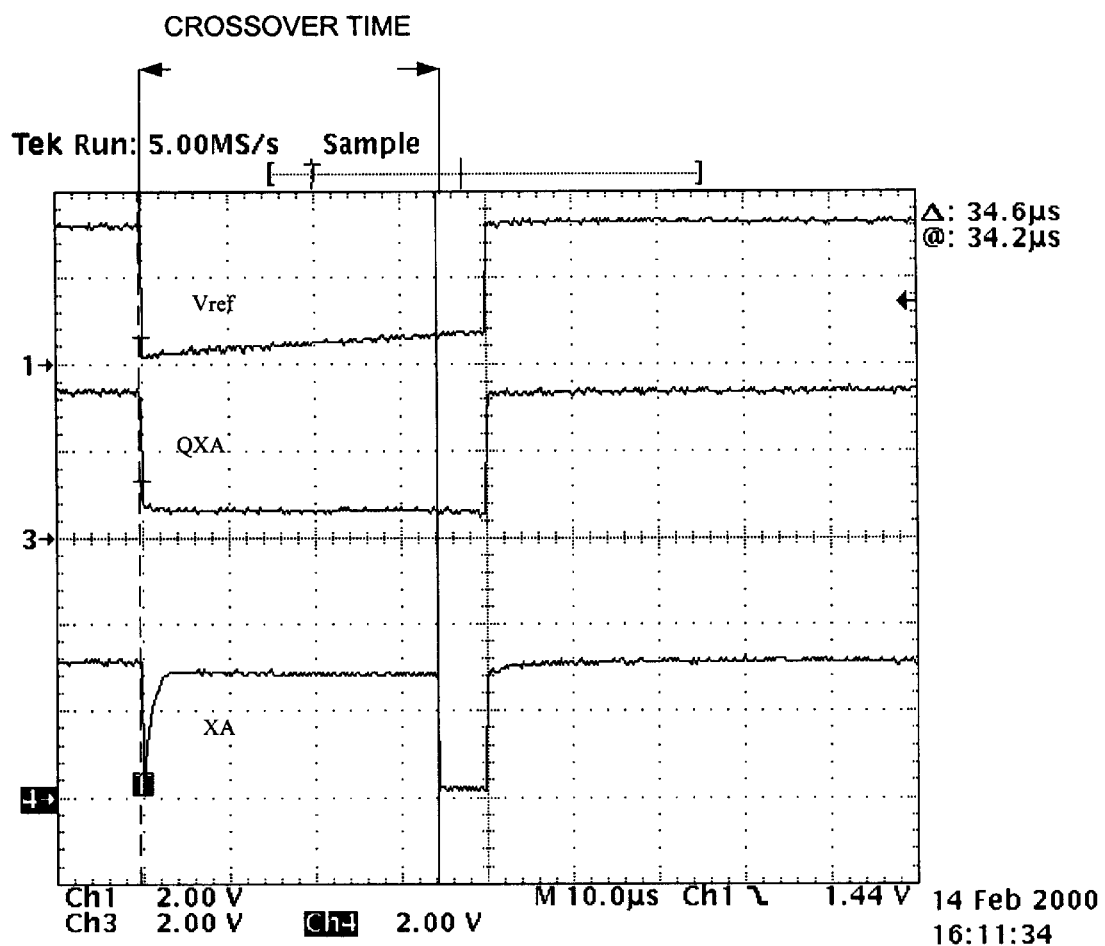
FIG. 4 is an oscilloscope trace of alternative input signals and an output signal for a comparator, in accordance with the invention.

The crossover time is the amount of time it takes for the ramp signal $V_{ref}$ to reach a voltage level substantially equal to the output of the photodetector, QXA 16. As can be seen by the oscilloscope trace in FIG. 4, the amount of time between the two vertical lines is the crossover time. At the point in time shown by the right most vertical line, $V_{ref}$ is substantially equal to QXA. Since these signals are both inputs to the comparator U401D, the output of the comparator, XA, goes low at this point. The output XA is repeatedly sampled by the microcontroller, which then determines the width of the pulse, thereby, determining the voltage level.

The purpose of the resistors RP402D and RP402C is to provide positive feedback to prevent any oscillation when the voltage level crosses the ramp reference voltage. When the phototransistor (PTR) level starts out higher than the ramp voltage, which is typically the case, the output of the comparator is high. This pulls the output of the PTR level slightly higher, since the output is fed back through the resistor to the positive input. When the ramp voltage crosses the PTR level, the output of the comparator goes low and pulls the PTR voltage slightly lower. This increases the gaps between the PTR voltage and the ramp voltage, preventing oscillations across the crossover point.

In this example, the voltage for QXA is relatively high. It takes the ramp signal 34 microseconds to reach a commensurate voltage level. In further analysis done after the sampling, the resulting pulse may have a width that corresponds to a 1 output for XA. The analysis of the samples and the parameters for determining what width corresponds to a 1 or a 0 is beyond the scope of this disclosure.

Figure 5:
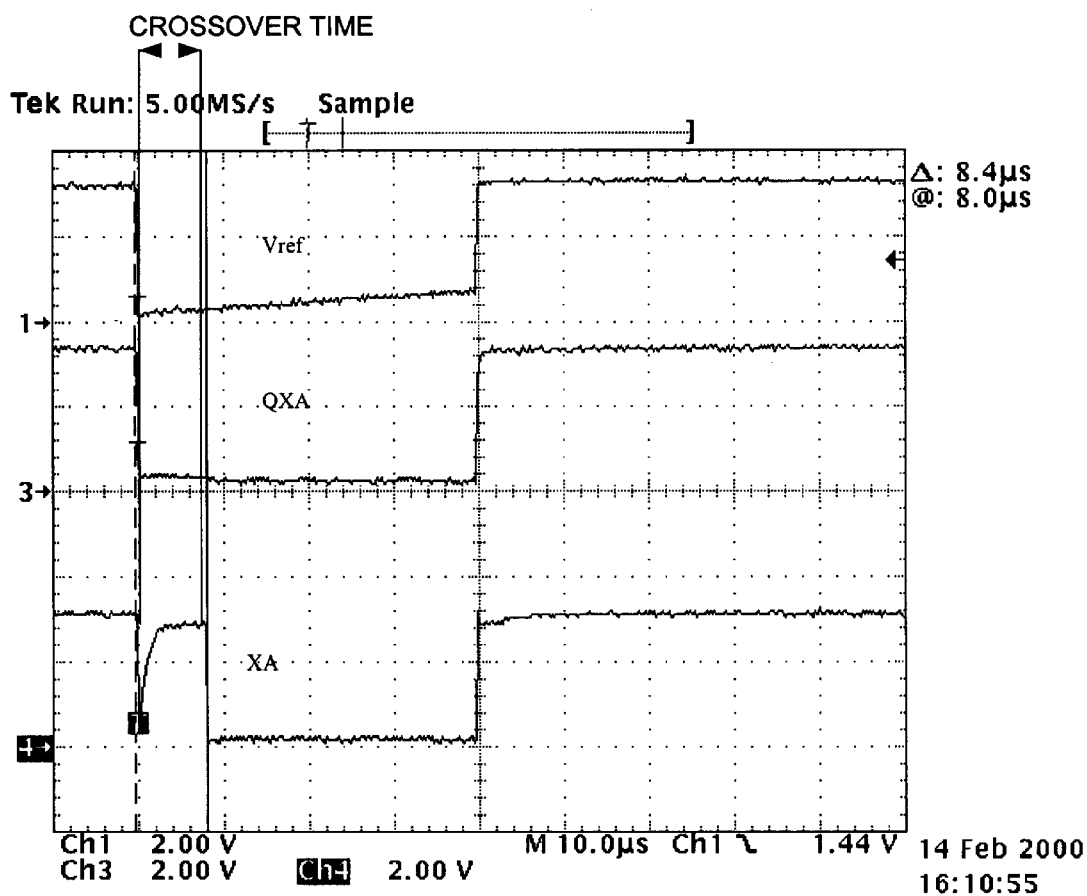
FIG. 5 is an oscilloscope trace of other alternative input signals and an output signal for a comparator, in accordance with the invention.

However, a contrasting example is shown in FIG. 5. In this instance, QXA is relatively low. The photodetector is not receiving as much light. It only takes the ramp signal 8 microseconds to reach the commensurate voltage level as QXA. As an example, the small width of the resulting pulse may be determined to be a 0.

The shape of the ramp signal $V_{ref}$ determines the behavior of the output signal XA. A more detailed discussion of the ramp generator circuit 18 of FIG. 1 can be had with reference to FIG. 2. A general consideration for the specifics of a ramp generator is that the minimum and maximum voltage for each photodetector can vary 50%, or more, from the worst-case device to the best-case device. The circuit must accommodate the full range of these situations for better manufacturing tolerance for the device.

Another consideration is that the output of the comparator XA has to be sampled with sufficient resolution to allow for the determination of a 1 or 0. The rise of the ramp cannot be too fast, preventing collection of a sufficient number of samples. In one implementation of the invention, 8 sample points were determined to be sufficient resolution to perform the necessary analysis. However, in other circuits, more or less multiple samples may be used. In some embodiments the microcontroller may sample the pulse, store the results and perform the analysis on the stored results.

In one example of a method for determining if the voltage output is a 1 or a 0, a circuit or software is used to determine when the PTR voltage has changed states. For example, the PTR may start in the dark region. As the decoder wheel spins, the PTR is exposed to more and more light. After it reaches maximum exposure, resulting in maximum voltage, the wheel will continue to spin and the PTR will receive less light, dropping the PTR voltage. Another hysterisis analysis, similar to that performed on the crossover voltage, may be performed to determine when the voltage is a 1 and when it was a 0.

Figure 2:
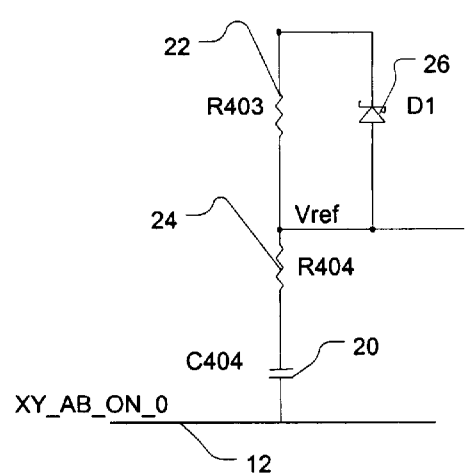
FIG. 2 is an oscilloscope trace of an input signal and a reference voltage, in accordance with the invention.

Specific consideration for the voltage generated in FIG. 2 includes selection of the values of the voltage divider and the capacitor. The slope of the resistor capacitor combination (RC) should be chosen so that the difference between the minimum and maximum voltage of an average device is about 8 samples of the microcontroller, as mentioned above. Additionally, if a voltage divider such as that formed by R403 22 and R404 24 is used, the selection of the values of these resistors will determine the lowest voltage point of the ramp signal.

In one example, the voltage point was set low enough such that the crossing point for an average minimum and maximum voltage of a worst-case, small signal, device is on the second microcontroller sample, or greater. Similarly, the high voltage level was set so the crossing point for an average minimum and maximum voltage of a best case, highest signal level, device is on the second to the last sample, or sooner. This resulted in optimal operation of the circuit shown in FIG. 1.

In the particular example of FIG. 2, a Schottky diode D1 26 is used to speed the discharge of the capacitor C404 20 between pulses. The lowest voltage point will be determined by any residual charge on the capacitor and the values set for the voltage divider, as mention above. Therefore, it is desirable to discharge the capacitor between pulses to allow for a stable low voltage level for the ramp signal. The capacitor C404 20 is one of the main determinants of the slope of the ramp signal. As the capacitor charges up from the pulsed XY_AB_ON_0 signal, the signal ramps up.

In this manner, a method and apparatus for determining the necessary output signals used in quadrature detection is provided. The LEDs providing light to the photodetectors can be pulsed with the state information stored between samples, resulting in more accurate data. This allows quadrature detection devices, such as that used in user pointing devices, to save power.

Thus, although there has been described to this point a particular embodiment for a method and apparatus for pulsing LEDs in optical detection systems, it is not intended that such specific references be considered as limitations upon the scope of this invention except in-so-far as set forth in the following claims.

What is claimed is:

1. A system for measuring output from a photodetector comprising:
    a photodetector to generate a photodetector output signal;
    a ramp generator to generate a ramp signal; and
    a comparator to:
        compare the ramp signal with the photodetector output signal; and
        generate an output signal having a pulse width of length proportional to a time period during which the ramp signal reaches a level at which it exceeds the photodetector output signal, the output signal combined with the photodetector output signal as feedback.

2. The system of claim 1, wherein the system further comprises a microcontroller operable to repeatedly sample the photodetector output signal and store resulting samples.

3. The system of claim 1, wherein the ramp generator further comprises a capacitor coupled to a pulsed input signal.

4. The system of claim 3, wherein the ramp generator further comprises a resistor divider and a diode coupled to the capacitor.

5. A method of converting a varying voltage level to a varying width pulse, the method comprising:
   generating a ramp signal for use as an input to a comparator;
   providing a photodetector output signal as an input to the comparator;
   producing an output signal of the comparator having a crossover point; and
   sampling the output signal of the comparator to produce a digital pulse of a width proportional to the varying voltage level.

6. The method of claim 5, wherein generating the ramp signal further comprises generating a ramp voltage by a capacitor coupled to a pulsed signal.

7. The method of claim 5, wherein generating the ramp signal further comprises generating a ramp voltage that varies between a minimum voltage and a maximum voltage.

8. The method of claim 5, wherein the average crossover point occurs between a second sample and a second to last sample by the microcontroller.

* * * * *